(12) United States Patent
Hu et al.

(10) Patent No.: US 8,507,355 B2
(45) Date of Patent: Aug. 13, 2013

(54) MANUFACTURING METHOD OF A HIGH PERFORMANCE METAL-OXIDE-METAL

(75) Inventors: Youcun Hu, Shanghai (CN); Lei Li, Shanghai (CN); Chaos Zhang, Shanghai (CN); Feng Ji, Shanghai (CN); Yuwen Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/339,593

(22) Filed: Dec. 29, 2011

(65) Prior Publication Data

US 2012/0322256 A1 Dec. 20, 2012

(30) Foreign Application Priority Data

Jun. 17, 2011 (CN) .......................... 2011 1 0163855

(51) Int. Cl.
*H01L 21/20* (2006.01)
(52) U.S. Cl.
USPC .... 438/393; 257/306; 257/532; 257/E21.294; 257/E21.396; 438/239; 438/240; 438/253; 438/381

(58) Field of Classification Search
USPC ................. 257/306, 532, E21.294, E21.396; 438/239, 240, 253, 381, 393
See application file for complete search history.

(56) References Cited

U.S. PATENT DOCUMENTS

| | | |
|---|---|---|
| 2004/0245606 A1* | 12/2004 | Chiang et al. ................. 257/635 |
| 2006/0207965 A1* | 9/2006 | Ramaghandramurthy Pradeep et al. .............................. 216/13 |

* cited by examiner

*Primary Examiner* — Asok K Sarkar
(74) *Attorney, Agent, or Firm* — McDonnell Boehnen Hulbert & Berghoff LLP

(57) ABSTRACT

A method of manufacturing high performance metal-oxide-metal capacitor device that resolves problems with implementing high capacitance in the metal-oxide-metal region by filling with a low-k material both in the metal-oxide-metal region and the metal interconnection region, utilizing performing selective photolithography and etching of the first dielectric layer to define metal-oxide-metal (MOM for short) region, and filling the MOM region with high dielectric constant (high-k) material to realize a high performance MOM capacitor.

14 Claims, 3 Drawing Sheets

MANUFACTURING METHOD OF A HIGH PERFORMANCE METAL-OXIDE-METAL

CROSS REFERENCE TO RELATED APPLICATIONS

The present invention claims priority under 35 U.S.C. §119 to Chinese Patent Application No. 201110163855.2, filed on Jun. 17, 2011, the entire content of which is incorporated herein by reference.

FIELD OF THE INVENTION

The present invention relates to the semiconductor manufacturing field, and more particularly to a manufacturing method for implementing high performance metal-oxide-metal capacitor device.

BACKGROUND OF THE INVENTION

As the dimension of CMOS (Complementary Metal Oxide Semiconductor) devices continuously scaling-down, the dielectric constant k-value of dielectric used in the interconnection has also been continuously reducing, and novel dielectric materials have been constantly sought, developed from the primely simplex silicon oxide to FSG and SiOC, until to the porous ultra low-k films under 45 nm node.

However, as the k-value of film reducing, more area is required for integrating capacitor C with same size into the interconnection, and the waste of area results in increasing cost of manufacturing chips.

SUMMARY OF THE INVENTION

The present invention discloses a manufacturing method of a high performance metal-oxide-metal capacitor device, for solving the problems of incapably implementing high capacitance in metal-oxide-metal region according to prior art resulting from filling with low-k materials both in metal-oxide-metal region and metal interconnection region.

The aforesaid object of the present invention is achieved by implementing the following technical scheme:

A manufacturing method of a high performance metal-oxide-metal capacitor device, which comprises:

Step a, successively depositing an etch stopping layer and a first dielectric layer on a substrate;

Step b, spin coating photo-resist over the first dielectric layer, and forming a pattern of a metal-oxide-metal region by photolithography;

Step c, forming a metal-oxide-metal region groove by etching, so that the metal-oxide-metal region groove stops at the etch stopping layer, and then removing the photo-resist;

Step d, depositing a second dielectric layer on the first dielectric layer, so that the second dielectric layer fulfills the metal-oxide-metal region groove;

Step e, performing chemical mechanic polishing, preserving the second dielectric layer within the metal-oxide-metal region groove, and removing the remainder parts thereof;

Step f, forming a metal interconnection groove on the first dielectric layer by photolithography and etching, and simultaneously fanning a metal-oxide-metal groove on the second dielectric layer;

Step g, performing deposition of a copper diffusion barrier layer as simultaneously forming the metal interconnection groove and metal-oxide-metal groove, performing copper plating process for forming copper interconnection and then performing.

The manufacturing method of the high performance metal-oxide-metal capacitor device as above-mentioned, wherein the dielectric constants of materials used in depositing the first dielectric layer and the second dielectric layer are different.

The manufacturing method of the high performance metal-oxide-metal capacitor device as above-mentioned, wherein the material used in depositing the first dielectric layer is a high-k material, and that used in depositing the second dielectric layer is a low-k material.

The manufacturing method of the high performance metal-oxide-metal capacitor device as above-mentioned, wherein the material used in forming the first dielectric layer is chosen from the group of USG (undoped silicon glass), FSG (fluorine-doped silicon glass), BD (black diamond (k value:3.0)), BDI (black diamond I (k value: ~2.7)), BDII (black diamond II (K value: ~2.55)), and the like.

The manufacturing method of the high performance metal-oxide-metal capacitor device as above-mentioned, wherein the range of thickness of the first dielectric layer is controlled within 1000~10000 A.

The manufacturing method of the high performance metal-oxide-metal capacitor device as above-mentioned, wherein the material used in forming the second dielectric layer is chosen from the group of USG, FSG, BD, BDI, BDII, and the like.

The manufacturing method of the high performance metal-oxide-metal capacitor device as above-mentioned, wherein the range of thickness of the second dielectric layer is controlled within 1000~10000 A.

In order to achieve the objective mentioned above, another technical resolution of the present invention is stated as follows:

A manufacturing method of a high performance metal-oxide-metal capacitor device, which comprises:

Step a, successively depositing an etch stopping layer and a first dielectric layer on a substrate;

Step b, spin coating photo-resist over the first dielectric layer, and forming pattern of metal interconnection region by photolithography;

Step c, forming a metal interconnection region groove by etching, so that the metal interconnection region groove stops at the etch stopping layer, and then removing the photo-resist;

Step d, depositing a second dielectric layer on the first dielectric layer, so that the second dielectric layer fulfills the metal interconnection region groove;

Step e, performing chemical mechanic polishing, preserving the second dielectric layer within the metal interconnection region groove, and removing the remainder parts thereof;

Step f, forming a metal-oxide-metal groove on the first dielectric layer by photolithography and etching, and simultaneously forming a metal interconnection on the second dielectric layer;

Step g, performing deposition of a copper diffusion barrier layer as simultaneously forming the metal interconnection groove and metal-oxide-metal groove, performing copper plating process for forming copper interconnection and then performing chemical mechanic polishing after that.

The manufacturing method of the high performance metal-oxide-metal capacitor device as above-mentioned, wherein the dielectric constants of materials used in depositing the first dielectric layer and the second dielectric layer are different.

The manufacturing method of the high performance metal-oxide-metal capacitor device as above-mentioned, wherein the material used in depositing the first dielectric layer is a low-k material, and that used in depositing the second dielectric layer is a high-k material.

The manufacturing method of the high performance metal-oxide-metal capacitor device as above-mentioned, wherein the material used in forming the first dielectric layer is chosen from the group of USG, FSG, BD, BDI, BDII and the like.

The manufacturing method of the high performance metal-oxide-metal capacitor device as above-mentioned, wherein the range of thickness of the first dielectric layer is controlled within 1000~10000 A.

The manufacturing method of the high performance metal-oxide-metal capacitor device as above-mentioned, wherein the material used in forming the second dielectric layer is chosen from the group of USG, FSG, BD, BDI, BDII and the like.

The manufacturing method of the high performance metal-oxide-metal capacitor device as above-mentioned, wherein the range of thickness of the second dielectric layer is controlled within 1000~10000 A.

As above mentioned, due to using the above-mentioned technical scheme, the manufacturing method of the high performance metal-oxide-metal capacitor device according to the present invention resolves the problems of incapably implementing high capacitance in a metal-oxide-metal region according to prior art resulting from filling with low-k materials both in the metal-oxide-metal region and the metal interconnection region. By utilizing the performance of selective photolithography, etching of the first dielectric layer to define the metal-oxide-metal (MOM for short) region, and fulfilling the MOM region with high dielectric constant (high-k) material, high performance of the MOM capacitor can be realized. By using the present method, the high-k material and low-k material within the same film layer can be realized. High-k material region can be used as MOM to achieve high capacitor, thereby reducing the area used by chips and further improving the electrics performance.

DETAILED DESCRIPTION OF THE EMBODIMENTS

The detail implementation of the present invention will be described in detail by referring the drawings:

Example 1

Figure 1:
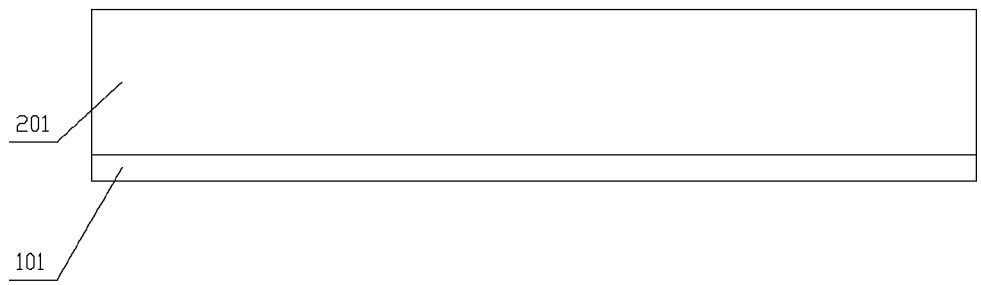
FIG. 1 illustrates a schematic view of the manufacturing method of a high performance metal-oxide-metal capacitor device according to the present invention after depositing an etch the stopping layer and a first dielectric layer.

The present invention discloses a manufacturing method of a high performance metal-oxide-metal capacitor device. FIG. 1 illustrates the schematic view of the manufacturing method of the high performance metal-oxide-metal capacitor device according to the present invention after depositing an etch stopping layer 101 and a first dielectric layer 201. In step a: the etch stopping layer 101 and the first dielectric layer 201 on a substrate is deposited. Since the first dielectric layer 201 acts as a metal interconnection region in later processes, the metal interconnection region needs to be used with low-k material, so that the material for depositing the first dielectric layer 201 is low-k material.

In one embodiment of the present invention, the material used in forming the first dielectric layer 201 is chosen from the group of USG, FSG, BD, BDI, BDII, and the like. Moreover, the range of the thickness of the first dielectric layer 201 is controlled within 1000~10000 A.

Figure 2:
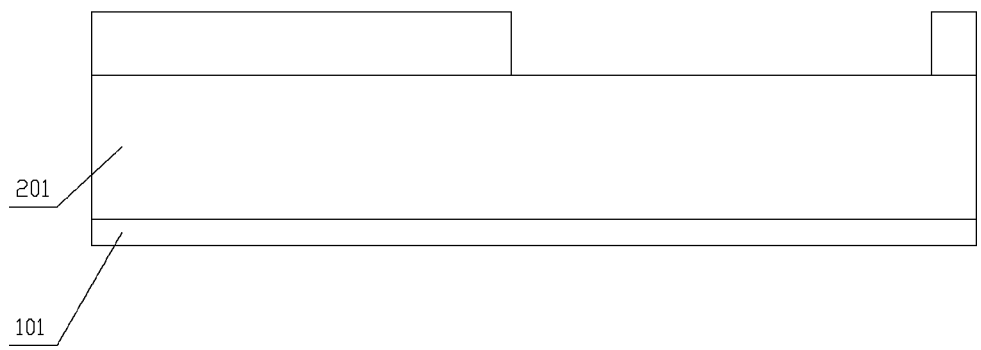
FIG. 2 illustrates the schematic view of the manufacturing method of the high performance metal-oxide-metal capacitor device according to the present invention after forming a metal-oxide-metal region pattern.

FIG. 2 illustrates the schematic view of the manufacturing method of the high performance metal-oxide-metal capacitor device according to the present invention after forming a metal-oxide-metal region pattern. In step b: photo-resist is spin coated over the first dielectric layer 201 and the pattern of the metal-oxide-metal region is formed by photolithography, so that a metal-oxide-metal groove 2021 (showed in FIG. 6) can be formed by etching in later processes.

Figure 3:
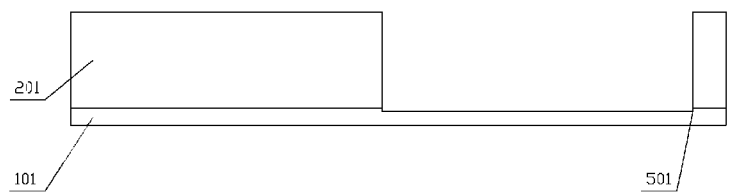
FIG. 3 illustrates the schematic view of the manufacturing method of the high performance metal-oxide-metal capacitor device according to the present invention after forming a metal-oxide-metal region groove.

FIG. 3 illustrates the schematic view of the manufacturing method of the high performance metal-oxide-metal capacitor device according to the present invention after forming a metal-oxide-metal region groove. In step c, the metal-oxide-metal region groove 501 is formed by etching, so that the metal-oxide-metal region groove 501 stops at the etch stopping layer 101, and then the photo-resist is removed to prepare for fulfilling a second dielectric layer 202.

Figure 4:
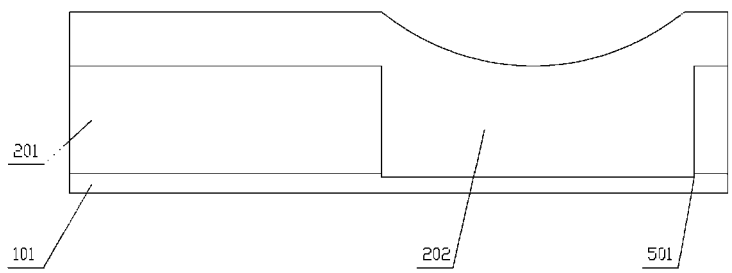
FIG. 4 illustrates the schematic view of the manufacturing method of the high performance metal-oxide-metal capacitor device according to the present invention after forming a second dielectric layer.

FIG. 4 illustrates the schematic view of the manufacturing method of the high performance metal-oxide-metal capacitor device according to the present invention after forming the second dielectric layer 202. In step d, the second dielectric layer 202 is deposited on the first dielectric layer 201, so that the second dielectric layer 202 fulfills the metal-oxide-metal region groove 501. Since the metal-oxide-metal region needs to be filled with high-k material to achieve high capacitance, the material used in depositing the first dielectric layer 201 is different from that used in depositing the second dielectric layer 202, wherein the material used in depositing the second dielectric layer 202 is high-k material.

In one embodiment of the present invention, the material used in forming the second dielectric layer 202 is chosen from the group of USG, FSG, BD, BDI, BDII and the like.

Moreover, the range of the thickness of the second dielectric layer 202 is controlled within 1000~10000 A.

Figure 5:
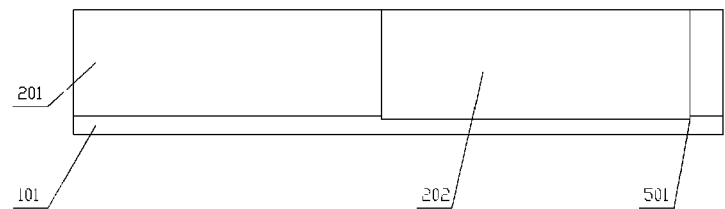
FIG. 5 illustrates the schematic view of the manufacturing method of the high performance metal-oxide-metal capacitor device according to the present invention after chemical mechanic polishing.

FIG. 5 illustrates the schematic view of the manufacturing method of the high performance metal-oxide-metal according to the present invention after chemical mechanic polishing. In step e, chemical mechanic polishing is performed, the second dielectric layer 202 which located within the metal-oxide-metal region groove 501 is preserved, and the remainder parts of the second dielectric layer 202 is removed wherein the upper surface of the second dielectric layer 202 within the metal-oxide-metal region groove 501 and the upper surface of the first dielectric layer 201 are on the same plane.

Figure 6:
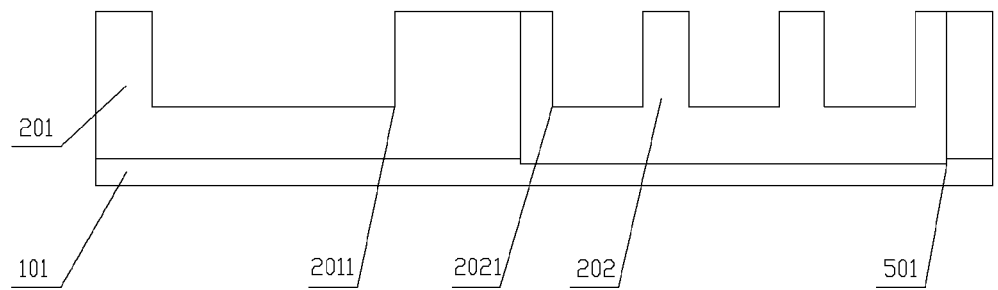
FIG. 6 illustrates the schematic view of the manufacturing method of the high performance metal-oxide-metal capacitor device according to the present invention after forming a metal interconnection groove and metal-oxide-metal groove.

FIG. 6 illustrates the schematic view of the manufacturing method of the high performance metal-oxide-metal according to the present invention after forming the metal interconnection groove 2011 and metal-oxide-metal groove 2021. In step f, the metal interconnection groove 2011 on the first dielectric layer 201 is formed by photolithography and etching, and a metal-oxide-metal groove 2021 on the second dielectric layer 202 simultaneously formed. This process enables the metal interconnection groove 2011 to stay within a low-k dielectric layer and the metal-oxide-metal groove 2021 within a high-k dielectric layer, so as to achieve high performance of the metal-oxide-metal capacitor device through later processes.

Figure 7:
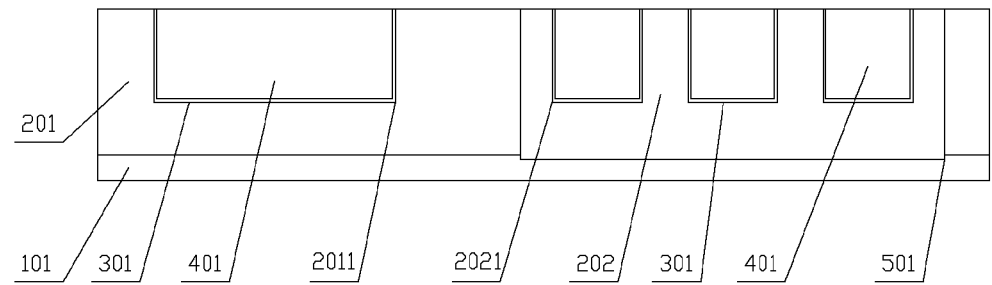
FIG. 7 illustrates the schematic structure view of the manufacturing method of the high performance metal-oxide-metal capacitor device according to the present invention after finishing all processes.

FIG. 7 illustrates the schematic structure view of the manufacturing method of the high performance metal-oxide-metal capacitor device according to the present invention after finishing all processes. In step g: a copper diffusion barrier layer 301 is deposited simultaneously as the metal interconnection groove 2011 and the metal-oxide-metal groove 2021 are formed, a copper plating process for forming copper interconnection 401 and then chemical mechanic polishing are performed, by which the high-k material and low-k material within the same film layer are realized, wherein high-k material region is used as MOM to achieve high capacitor, thereby reducing the area used by chips and further improving the electrics performance. The upper surfaces of the first dielectric layer 201 and the second dielectric layer 202 are located on the same plane. The second dielectric layer 202 is filled within the groove that is opened on the first dielectric layer 201, so that the first dielectric layer 201 and the second dielectric layer 202 can be considered as the same film layer.

Example 2

Based on the example 1, according to the present invention, the orders of processing metal interconnection parts and metal-oxide-metal parts may be alternated, i.e accomplishing the depositing of a high-k layer first, then forming a metal interconnection groove by etching, and further performing the depositing of a low-k layer. The specific technical principle of example 2 is similar to example 1

A manufacturing method of a high performance metal-oxide-metal capacitor device, which comprises:

Step a: successively depositing an etch stopping layer and a first dielectric layer on a substrate;

According to the present invention, the material used in depositing the first dielectric layer is a low-k material, wherein the material used in forming the first dielectric layer can be chosen from the group of USG, FSG, BD, BDI, BDII and the like. Moreover, the range of thickness of the first dielectric layer is controlled within 1000~10000 A.

Step b, spin coating photo-resist over the first dielectric layer, and forming a pattern of a metal interconnection region by photolithography;

Step c, forming a metal interconnection region groove by etching, so that the metal interconnection region groove stops at the etch stopping layer, and then removing the photo-resist;

Step d, depositing a second dielectric layer on the first dielectric layer, so that the second dielectric layer fulfills the metal interconnection region groove;

In the embodiment, the dielectric constants of materials used in depositing the first dielectric layer and the second dielectric layer are different, wherein the material used in depositing the second dielectric layer is a high-k material, and the material used in forming the second dielectric layer can be chosen from the group of USG, FSG, BD, BDI, BDII and the like. Moreover, the range of thickness of the second dielectric layer is controlled within 1000~10000 A.

Step e, performing chemical mechanic polishing, preserving the second dielectric layer within the metal interconnection region groove, and removing the remainder parts thereof;

Step f, forming a metal-oxide-metal groove on the first dielectric layer by photolithography and etching, and simultaneously forming a metal interconnection on the second dielectric layer;

Step g, performing deposition of a copper diffusion barrier layer as simultaneously forming the metal interconnection groove and metal-oxide-metal groove, performing a copper plating process for forming copper interconnection and then performing chemical mechanic polishing.

As above mentioned, due to using the above-mentioned technical scheme, the manufacturing method of the high performance metal-oxide-metal capacitor device according to the present invention resolves the problems of implementing high capacitance in the metal-oxide-metal region by the steps of filling with the low-k materials both in the metal-oxide-metal region and metal interconnection region, utilizing performing selective photolithography and etching of the first dielectric layer to define the metal-oxide-metal (MOM for short) region, and fulfilling the MOM region with high dielectric constant (high-k) material to realize high performance MOM capacitor. Using the present method, high-k material and low-k material within the same film layer are realized. High-k material region is used as MOM to achieve high capacitor, thereby reducing the area used by chip and further improving the electrics performance.

Although specifically exemplary embodiments according to the present invention has been described as above-mentioned, the present invention does not intent to be restricted within the specifically exemplary embodiments as above-mentioned. For one skilled in the art, any equivalents of modification and substitution made to the present invention are also within the scope of the present invention without departing from the spirit and scope of the present invention.

The invention claimed is:

1. A manufacturing method of a high performance metal-oxide-metal capacitor device, which comprising:
   Step a: successively depositing an etch stopping layer and a first dielectric layer on a substrate;
   Step b: spin coating photo-resist over the first dielectric layer, and forming a pattern of a metal-oxide-metal region by photolithography;
   Step c: forming a metal-oxide-metal region groove by etching, so that the metal-oxide-metal region groove stops at the etch stopping layer, and then removing the photo-resist;
   Step d: depositing a second dielectric layer on the first dielectric layer, so that the second dielectric layer fulfills the metal-oxide-metal region groove;
   Step e: performing chemical mechanic polishing, preserving the second dielectric layer within the metal-oxide-metal region groove, and removing the remainder parts thereof, wherein an upper surface of the second dielectric layer within the metal-oxide-metal region groove and an upper surface of the first dielectric layer are on the same plane;

Step f: forming a metal interconnection groove on the first dielectric layer by photolithography and etching, and simultaneously forming a metal-oxide-metal groove on the second dielectric layer;

Step g: performing deposition of a copper diffusion barrier layer as simultaneously forming the metal interconnection groove and metal-oxide-metal groove, performing copper plating process filling all grooves for forming copper interconnection and then performing chemical mechanic polishing after that.

2. The manufacturing method according to claim 1, wherein the dielectric constants of materials used in depositing the first dielectric layer and the second dielectric layer are different.

3. The manufacturing method according to claim 1, wherein the material used in depositing the first dielectric layer is low-k material, and that used in depositing the second dielectric layer is a high-k material.

4. The manufacturing method according to claim 1, wherein the material used in forming the first dielectric layer is chosen from the group of USG, FSG, BD, BDI, BDII.

5. The manufacturing method according to claim 1, wherein the range of thickness of the first dielectric layer is controlled within 1000~10000 A.

6. The manufacturing method according to claim 1, wherein the material used in forming the second dielectric layer is chosen from the group of USG, FSG, BD, BDI, BDII.

7. The manufacturing method according to claim 1, wherein the range of thickness of the second dielectric layer is controlled within 1000~10000 A.

8. A manufacturing method of a high performance metal-oxide-metal capacitor device, which comprises:

Step a: successively depositing an etch stopping layer and a first dielectric layer on a substrate;

Step b: spin coating photo-resist over the first dielectric layer, and forming a pattern of a metal interconnection region by photolithography;

Step c: forming a metal interconnection region groove by etching, so that the metal interconnection region groove stops at the etch stopping layer, and then removing the photo-resist;

Step d: depositing a second dielectric layer on the first dielectric layer, so that the second dielectric layer fulfills the metal interconnection region groove;

Step e: performing chemical mechanic polishing, preserving the second dielectric layer within the metal interconnection region groove, and removing the remainder parts thereof, wherein an upper surface of the second dielectric layer within the metal-oxide-metal region groove and an upper surface of the first dielectric layer are on the same plane;

Step f: forming a metal-oxide-metal groove on the first dielectric layer by photolithography and etching, and simultaneously forming a metal interconnection groove on the second dielectric layer;

Step g: performing deposition of a copper diffusion barrier layer as simultaneously within the metal interconnection groove and metal-oxide-metal groove, performing copper plating process filling all grooves for forming copper interconnection and then performing chemical mechanic polishing after that.

9. The manufacturing method according to claim 8, wherein the dielectric constants of materials used in depositing the first dielectric layer and the second dielectric layer are different.

10. The manufacturing method according to claim 8, wherein the material used in depositing the first dielectric layer is a low-k material, and that used in depositing the second dielectric layer is a high-k material.

11. The manufacturing method according to claim 8, wherein the material used in forming the first dielectric layer is chosen from the group of USG, FSG, BD, BDI, BDII.

12. The manufacturing method according to claim 8, wherein the range of thickness of the first dielectric layer is controlled within 1000~10000 A.

13. The manufacturing method according to claim 8, wherein the material used in forming the second dielectric layer is chosen from the group of USG, FSG, BD, BDI, BDII.

14. The manufacturing method according to claim 8, wherein the range of thickness of the second dielectric layer is controlled within 1000~10000 A.

* * * * *